(12) United States Patent
Mineo et al.

(10) Patent No.: US 7,688,092 B2
(45) Date of Patent: Mar. 30, 2010

(54) MEASURING BOARD FOR ELECTRONIC DEVICE TEST APPARATUS

(75) Inventors: Hiroyuki Mineo, Tokyo (JP); Atsunori Shibuya, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/144,007

(22) Filed: Jun. 23, 2008

(65) Prior Publication Data

US 2009/0033347 A1 Feb. 5, 2009

Related U.S. Application Data

(63) Continuation of application No. 11/444,425, filed on Jun. 1, 2006, now Pat. No. 7,405,582.

(51) Int. Cl.
*G01R 31/02* (2006.01)

(52) U.S. Cl. .................. 324/754; 324/755; 324/765

(58) Field of Classification Search .................. None
See application file for complete search history.

(56) References Cited

U.S. PATENT DOCUMENTS

| 5,952,840 | A | 9/1999 | Farnworth et al. |
| 6,160,710 | A | 12/2000 | Ahl et al. |
| 6,457,979 | B1 | 10/2002 | Dove et al. |
| 6,498,299 | B2 | 12/2002 | Sekizuka |
| 6,930,240 | B1 | 8/2005 | Giboney et al. |
| 2001/0050177 | A1 | 12/2001 | Sekizuka |
| 2004/0212383 | A1* | 10/2004 | Yanagisawa et al. ........ 324/755 |
| 2005/0171718 | A1 | 8/2005 | Ito |
| 2005/0264307 | A1 | 12/2005 | Setaka |

FOREIGN PATENT DOCUMENTS

| DE | 10128365 | 2/2002 |
| EP | 0275634 | 7/1988 |
| JP | 61-71367 | 4/1986 |
| JP | 3-226680 | 10/1991 |

(Continued)

OTHER PUBLICATIONS

Mohammed R. Abdul-Gaffoor "Full wave analysis of electromagnetic couplin in realistic RF multilayer PCB layouts using cascaded parallel plate waveguide model" May 20-25, 2001, Microwave Symposium Digest 2001 IEEE MTT-S International vol. 3 pp. 1933-1936.
English language Abstract of JP 4-25777, Jan. 29, 1992.
English language Abstract of JP 11-74405, Mar. 16, 1999.

(Continued)

*Primary Examiner*—Minh N Tang
(74) *Attorney, Agent, or Firm*—Greenblum & Bernstein PLC (57) ABSTRACT

A performance board able to secure low loss, low reflection, stable transmission characteristics even when using a high frequency signal to test an electronic device and able to suppress signal leakage to the outside and entry of noise, provided with a base board having a signal pattern electrically connected with a socket formed on its front surface, a coaxial connector to which a coaxial cable electrically connecting the performance board and test apparatus is connected, passing through the base board from the back surface toward the front surface, and having a front exposed part of the center contact bent and electrically connected to the signal pattern, and a cover member covering the front exposed part of the center contact and correcting the impedance of the front exposed part.

8 Claims, 11 Drawing Sheets

| | FOREIGN PATENT DOCUMENTS | |
|---|---|---|
| JP | 3-126052 | 12/1991 |
| JP | 4-25777 | 1/1992 |
| JP | 11-74405 | 3/1999 |
| JP | 11-183564 | 7/1999 |
| JP | 2003-168609 | 6/2003 |

OTHER PUBLICATIONS

English language Abstract of JP 2003-168609, Jun. 13, 2003.
English language Abstract of JP 61-71367, Apr. 12, 1986.
English language Abstract of JP 3-226680, Oct. 7, 1991.
English language Abstract of JP 11-183564, Jul. 9, 1999.

* cited by examiner

Related Art

MEASURING BOARD FOR ELECTRONIC DEVICE TEST APPARATUS

CROSS-REFERENCE TO RELATED APPLICATIONS

This application is a continuation of U.S. patent application Ser. No. 11/444,425, filed on Jun. 1, 2006, which issued as U.S. Pat. No. 7,405,582, the contents of which are expressly incorporated by reference in its entirety.

BACKGROUND OF THE INVENTION

1. Field of the Invention

The present invention relates to a measurement board, performance board, and probe card for electrically connecting an IC device and a test apparatus when testing a semiconductor integrated circuit device or other various types of electronic devices (hereinafter also referred to representatively as "IC devices") by a test apparatus.

2. Description of the Related Art

In the process of production of an IC device or other electronic device, an electronic device test apparatus is used for testing the performance and functions of the IC device in the packaged state.

This electronic device test apparatus is provided with a performance board with a socket attached to its front surface and connected to a test head via a coaxial cable and tests an IC device by the transfer of test signals between an IC device electrically connected to the socket and the tester.

Above this performance board, a handler for transporting an IC device and pushing the IC device into the socket at the time of a test is provided. At the time of this connection, connection members and load bearing hardware are interposed between the performance board and handler, so the front surface of the performance board (surface of side where socket is attached) is preferably as flat as possible.

Figure 7A:
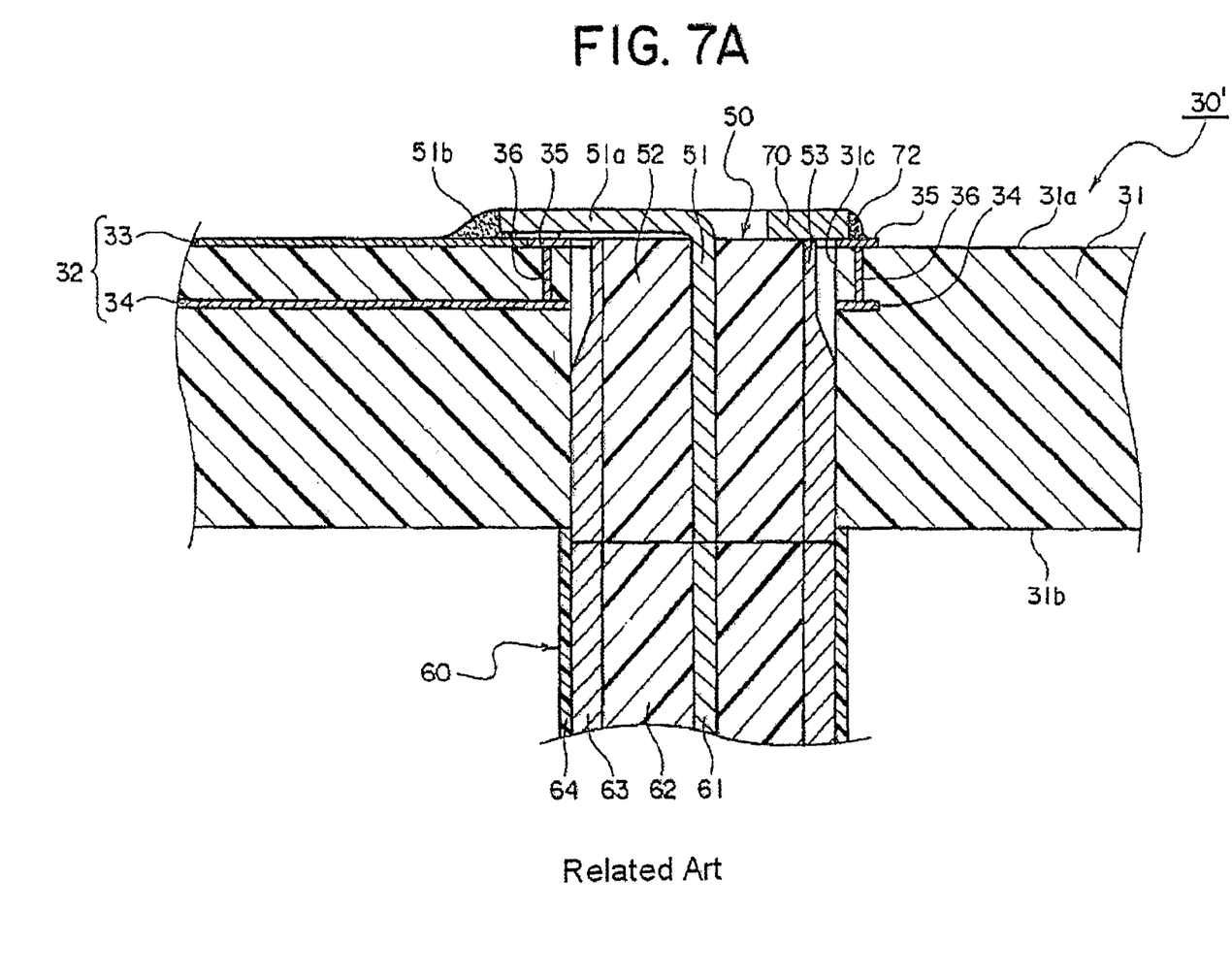
FIG. 7A is an enlarged sectional view of a connection part of a coaxial connector in a conventional performance board.
Figure 7B:
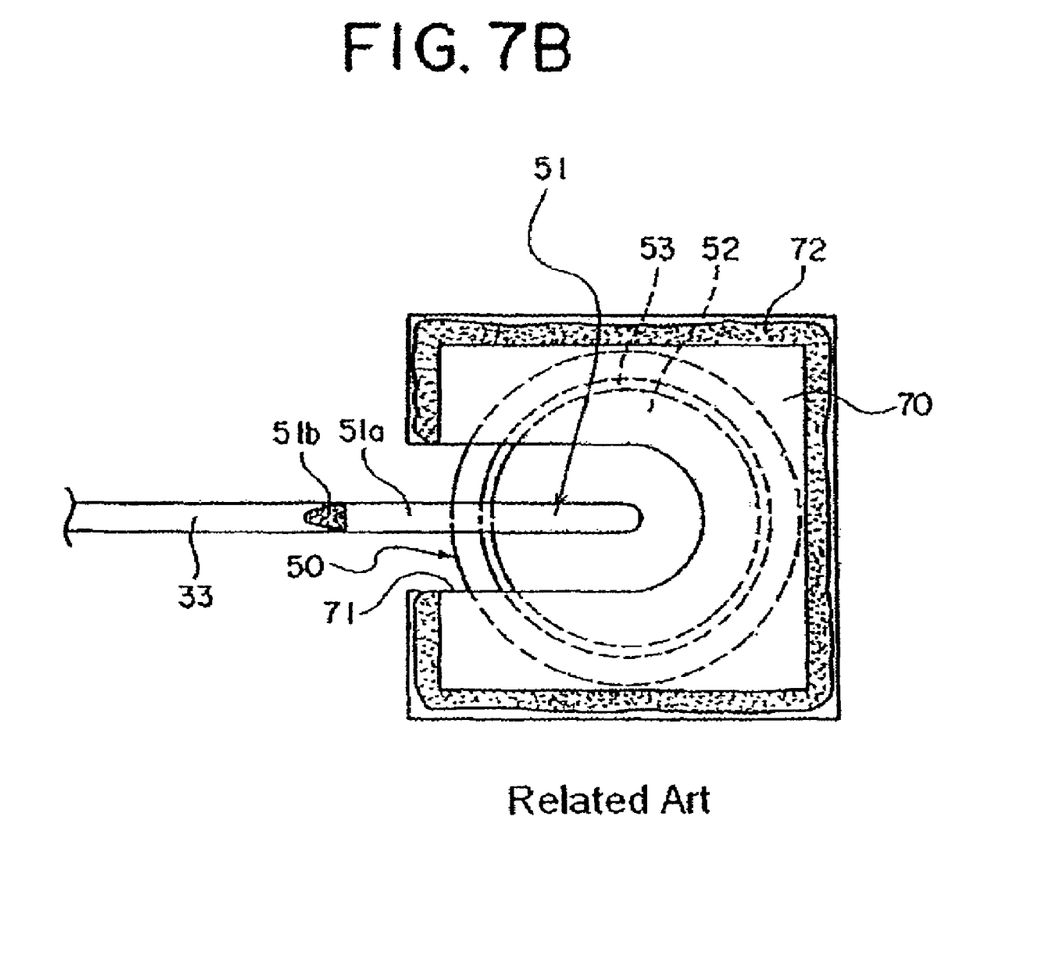
FIG. 7B is an enlarged plan view of a connection part of a coaxial connector in a conventional performance board.

As a performance board for solving this problem, one provided with a through-the-board type coaxial connector shown in FIG. 7A and FIG. 7B is known. As shown in these figures, the base board 31 of this performance board 30' is formed with a through hole 31c. The coaxial connector 50 passes through this through hole 31c from the back surface 31b of the base board 31 toward the front surface 31a. The front exposed part 51a of the center contact 51 is bent and electrically connected to a signal pattern 33 on the base board 31.

This performance board 30', as explained above, is superior in the point of its front surface 31a being flat, but the front exposed part 51a of the center contact 51 is not surrounded by the GND, but is exposed, so the impedance of the front exposed part 51a and the impedance around it do not match. In particular, in a test of an IC device performed using a high frequency signal of for example several GHz or more, there is large signal loss and reflection at the front exposed part 51a where the impedance mismatch occurs, so there is the problem that securing stable transmission characteristics is difficult.

Further, since the front exposed part 51a of the center contact 51 is bent by approximately 90 degrees, there is the problem of leakage of the high frequency signal from that part to the outside and easy entry of noise to the transmission line from the outside to the bent part.

SUMMARY OF THE INVENTION

An object of the present invention is to provide a measurement board, performance board, and probe card able to secure stable transmission characteristics with low loss and low reflection and suppress the leakage of the signal to the outside and the entry of noise even when using a high frequency signal to test an electronic device under test.

To achieve the above object, according to the present invention, there is provided a measurement board for electrically connecting an electronic device under test and a test apparatus, provided with a base board having a contactor to which the electronic device under test is to be electrically connected mounted on its front surface and having a signal conductor interconnect electrically connected to the contactor formed on its front surface, a coaxial connector having connected to it a coaxial cable for electrically connecting the measurement board and the test apparatus, passing through the base board from its back surface toward its front surface, and having a front exposed part of a center contact bent and electrically connected to the signal conductor interconnect, and a cover member covering at least part of the front exposed part of the center contact and correcting the impedance of the front exposed part of the center contact.

In the present invention, at least part of the front exposed part of the center contact of the coaxial connector passing through the base board is covered by the cover member to correct the impedance of the front exposed part. Due to this, the impedance of the front exposed part of the center contact can be matched with the surrounding impedance, so low loss, low reflection, stabilized transmission characteristics can be secured.

Further, since the bent front exposed part is covered by the cover member, it is possible to suppress leakage of the signal from the front exposed part to the outside and entry of noise through the front exposed part to the transmission line.

In the above invention, while not particularly limited to this, preferably the cover member has a first dielectric arranged around the front exposed part of the center contact and a first conductor interconnect arranged to face the front exposed part of the center contact across the first dielectric.

In the above invention, while not particularly limited to this, preferably the first conductor interconnect is a GND pattern formed on the front surface of the first dielectric, and the first dielectric has a thickness making the impedance of the front exposed part of the center contact match the impedance around the front exposed part.

In the above invention, while not particularly limited to this, preferably the first dielectric is comprised of a material the same as the material forming the base board.

In the above invention, while not particularly limited to this, preferably the cover member further has a plurality of second dielectrics arranged facing the front exposed part of the center contact across the first conductor interconnect and a plurality of second conductor interconnects stacked between the plurality of second dielectrics and on the topmost second dielectric, and the first conductor interconnect and the plurality of the second conductor interconnects are electrically connected through via holes.

By alternately stacking, in addition to the first dielectric and first conductor interconnect, a plurality of second dielectrics and second conductor interconnects, the cover member is increased in thickness, so attachment of the cover member to the base board becomes easier. Further, by electrically connecting the first conductor interconnect and the plurality of second conductor interconnects through the via holes, the first conductor interconnect can be reliably connected to the GND of the coaxial connector or the GND layer of the base board.

In the above invention, while not particularly limited to this, preferably the second dielectric is comprised of a material the same as the material forming the first dielectric.

In the above invention, while not particularly limited to this, preferably the surface of the cover member to be soldered to the base board has a metal plating layer. Due to this, the cover member can be easily attached to the base board.

To achieve the above object, according to the present invention, there is provided a performance board using any of the above measurement boards, wherein the electronic device under test is a packaged semiconductor device, and the contactor is a socket mounted on the front surface of the base board and electrically connected to the semiconductor device.

To achieve the above object, according to the present invention, there is provided a probe card using any of the above measurement boards, wherein the electronic device under test is a semiconductor device formed on a wafer, and the contactor is a probe needle mounted on the front surface of the base board and electrically connected to the semiconductor device.

To achieve the above object, according to the present invention, there is provided a cover member used for any of the above measurement boards.

By later attaching the cover member to the front exposed part of the center contact of the coaxial connector, it becomes possible to easily and inexpensively stabilize the transmission characteristics of a measurement board to which a through-the-board type of coaxial connector is already attached.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Preferred embodiments of the present invention will be described in detail below while referring to the attached figures.

Figure 1:
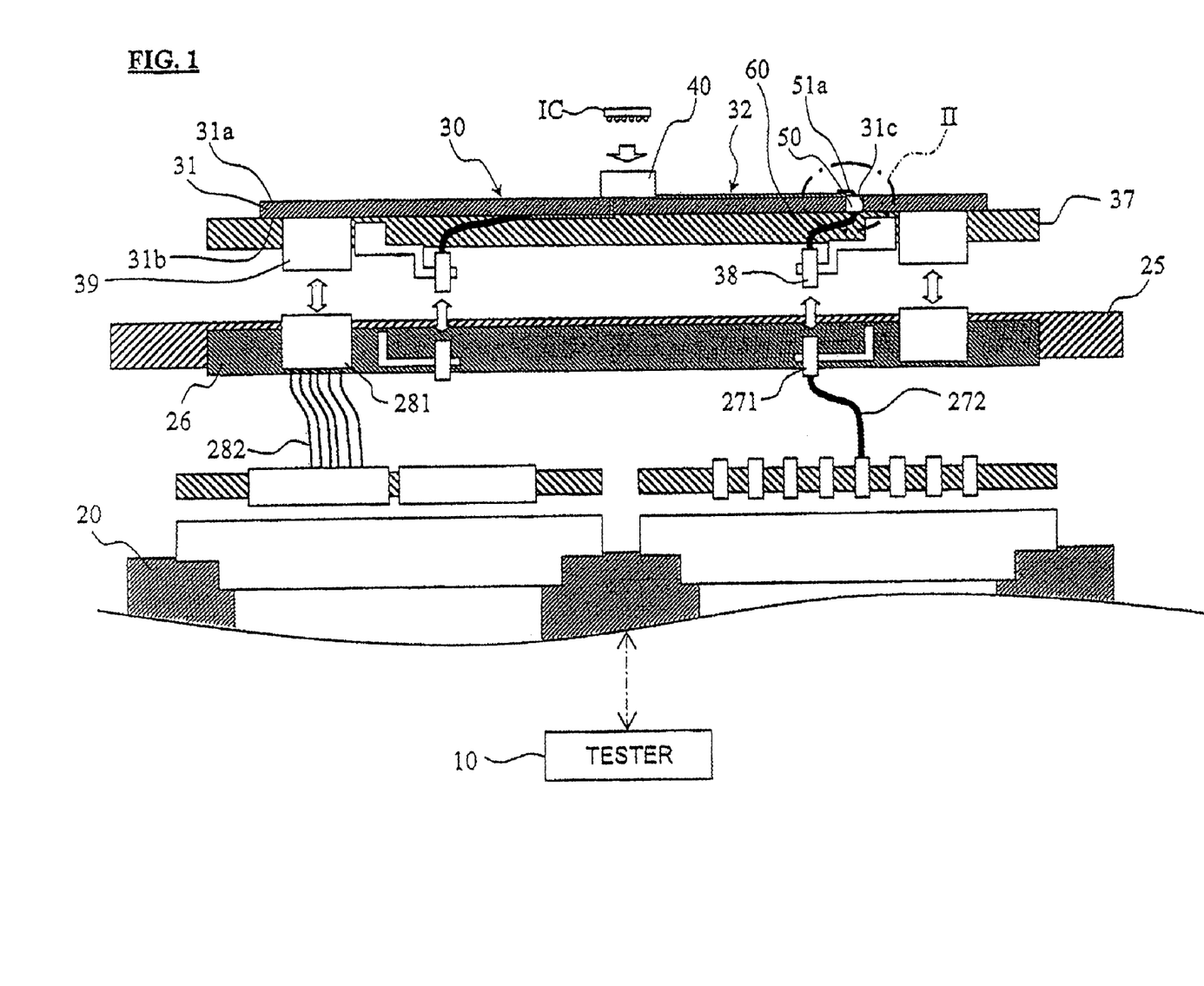
FIG. 1 is a schematic cross-sectional view showing the entirety of a performance board according to a first embodiment of the present invention.
Figure 2A:
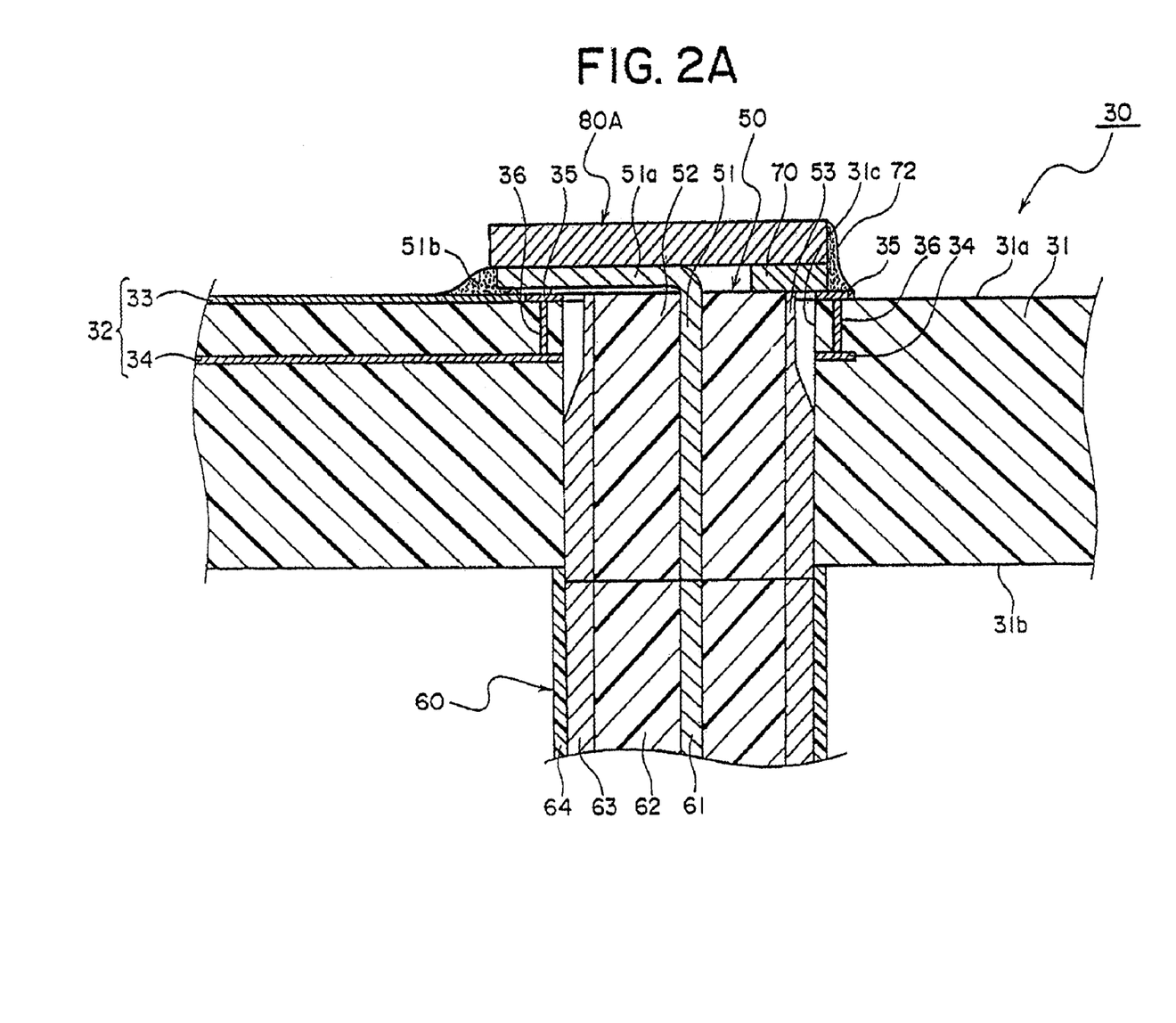
FIG. 2A is an enlarged sectional view of the part II of FIG. 1.
Figure 2B:
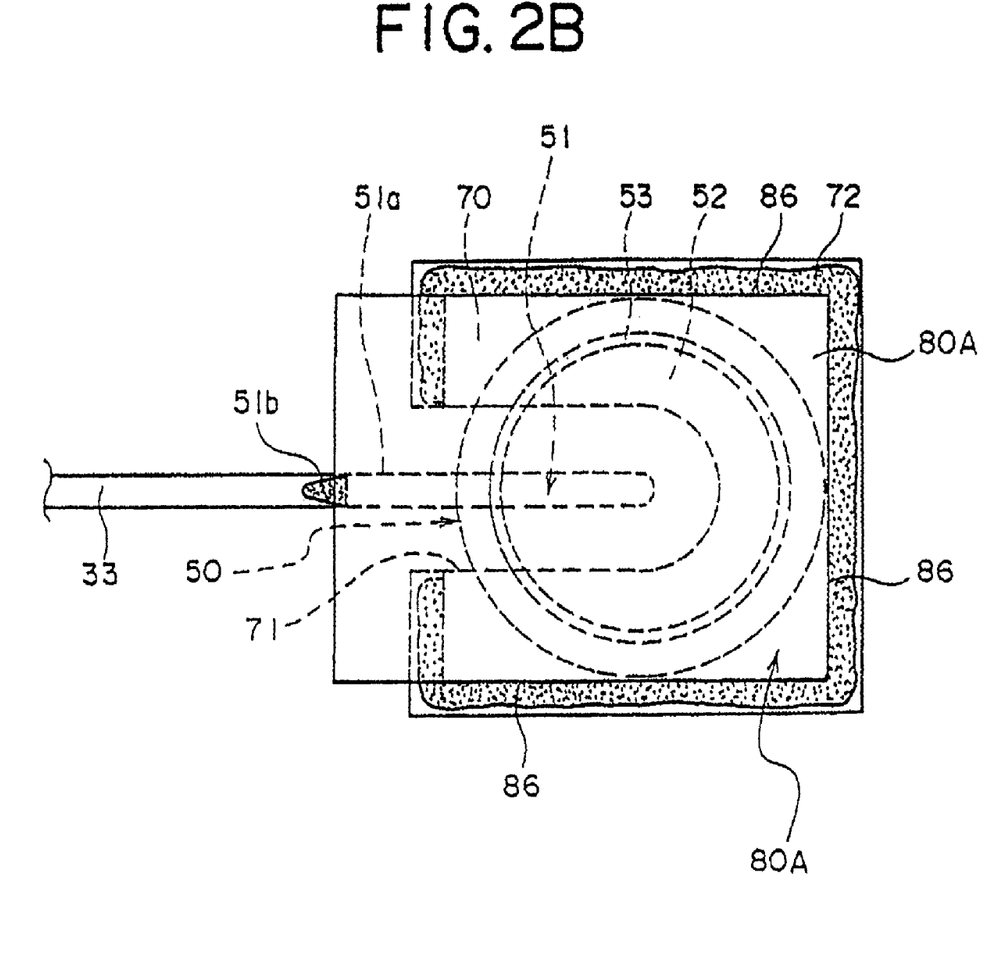
FIG. 2B is an enlarged plan view of the part II of FIG. 1.
Figure 3A:
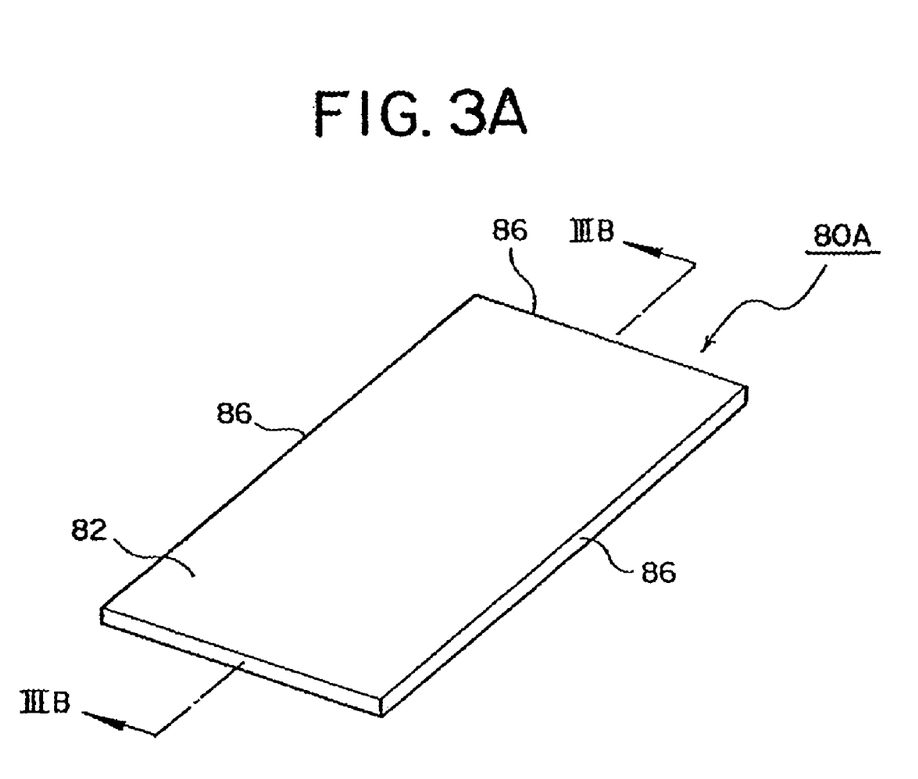
FIG. 3A is a perspective view of a cover member according to a first embodiment of the present invention.
Figure 3B:
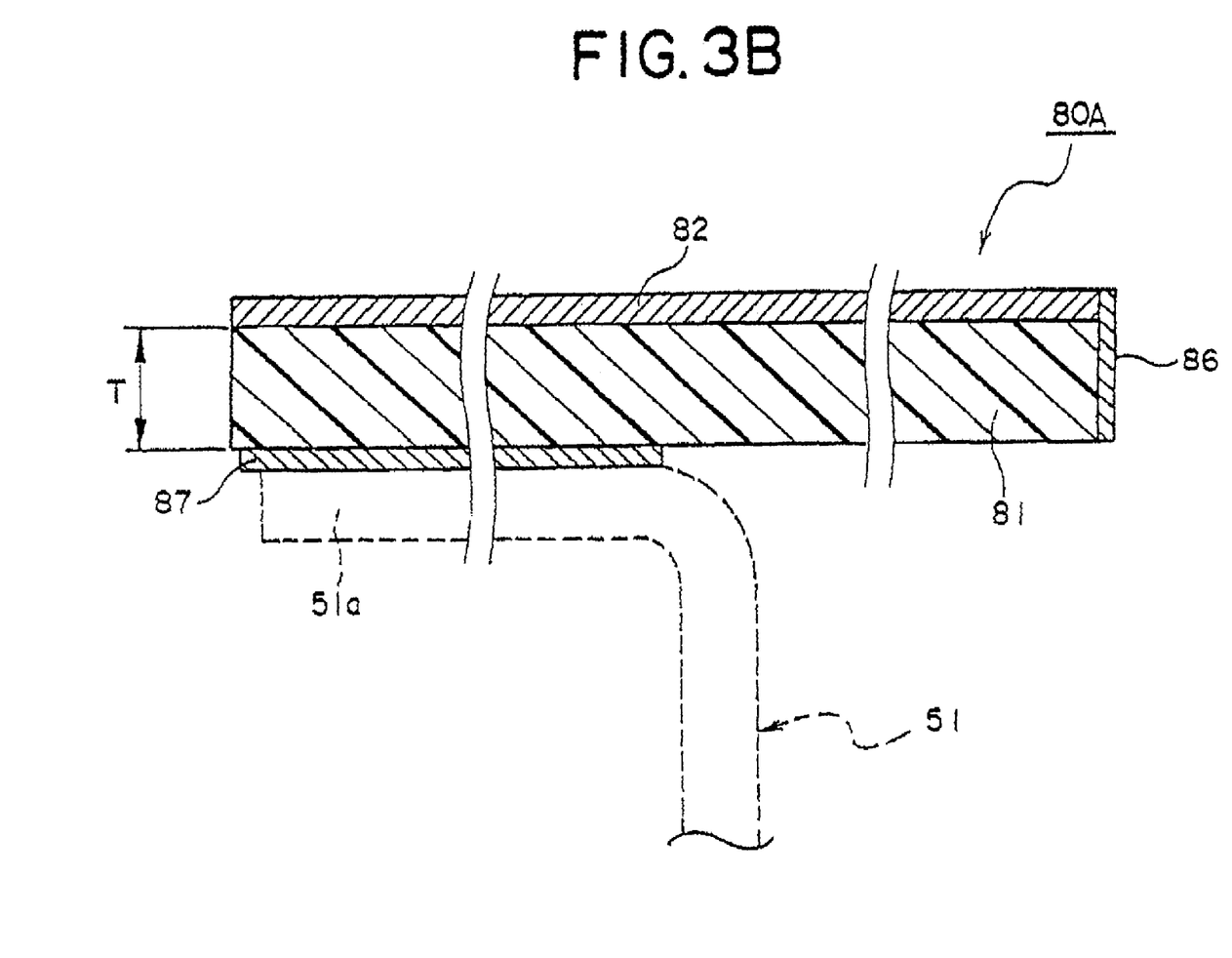
FIG. 3B is a sectional view along the line IIIB-IIIB of FIG. 3A.

FIG. 1 is a schematic cross-sectional view showing the entirety of a performance board according to a first embodiment of the present invention, FIG. 2A is an enlarged sectional view of the part II of FIG. 1, FIG. 2B is an enlarged plan view of the part II of FIG. 1, FIG. 3A is a perspective view of a cover member according to a first embodiment of the present invention, and FIG. 3B is a sectional view along the line IIIB-IIIB of FIG. 3A.

First, referring to FIG. 1, an electronic device test apparatus equipped with a performance board 30 according to a first embodiment of the present invention will be explained.

The electronic device test apparatus is provided with a tester 10 and a test head 20. Above the test head 20 is provided a top plate 25 on which is mounted a cylinder mechanism for precisely attaching and detaching a performance board 30. This top plate 25 has a center ring 26 enabling connectors to be precisely positioned at any positions. The test head 20 and the top plate 25 are connected by a coaxial cable 272 and a cable 282. Above the top plate 25 is further provided a performance board 30. The top plate 25 and the performance board 30 are electrically connected by coupling of a coaxial connector 271 of the top plate 25 and a coaxial connector 38 of the bottom side of the performance board 30 and by coupling of the connector 281 of the top plate 25 and the connector 39 of the performance board 30. Further, when a not particularly shown handler etc. is used to push the IC device under test into the socket 40 on the performance board 30, test signals are transferred between the IC device and the tester 10, whereby the IC device is tested.

The performance board 30 according to the present embodiment, as shown in FIG. 1, FIG. 2A, and FIG. 2B, is provided with a base board 31, coaxial connector 50, fixing member 70, and cover member 80A.

The base board 31 is comprised of a low dielectric material able to handle the test of an IC device using a high frequency signal. Specifically, for example, a polyimide resin or polytetrafluoroethylene (PTFE) etc. may be mentioned. As shown in the drawings, the front surface 31a of the base board 31 has a socket 40 mounted on it for electrical connection with the IC device at the time of a test. A signal pattern 33 is laid from this socket 40 to the through hole 31c. The through hole 31c is formed at a predetermined position of the base board 31 to pass through from the back surface 31b to the front surface 31a. Further, the back surface 31b of the base board 31 is provided with a stiffener 37 for improving the structural strength of the performance board 30 pushed by the handler etc.

As shown in FIG. 2A, the base board 31 has a GND layer 34 formed inside it. A microstrip line 32 for making the impedance of the signal pattern 33 substantially 50Ω or 75Ω or another value suitable for the transmission line used is formed by the signal pattern 33 and GND layer 34. Further, the base board 31 is formed at its front surface 31a around the through hole 31c with a GND pattern 35 electrically connected to the GND layer 34 through a via hole 36.

At the through hole 31c of the base board 31, a coaxial connector 50 is arranged so as to pass from the back surface 31b toward the front surface 31a. This coaxial connector 50 is connected at its bottom to one end of a coaxial cable 60. Note that the other end of this coaxial cable 60 is connected to a bottom coaxial connector 38 to which the coaxial connector 271 of the top plate 25 is connected.

The coaxial cable 60, as shown in FIG. 2A, is comprised of a center conductor 61, an insulating inside covering 62 covering this center conductor 61, an external conductor 63 provided at the outer circumference of the inside covering 62, and an insulating outside covering 64 covering the external conductor 63. The center conductor 61 and external conductor 63 are for example comprised of copper or another conductive material. The inside covering 62 is for example comprised of polytetrafluoroethylene (PTFE) or another low dielectric material. The inside covering 62 is provided between the center conductor 61 and the external conductor 63 so that the impedance of the center conductor 61 becomes substantially 50Ω or 75Ω or another value suitable for the transmission line used.

The coaxial connector 50 is comprised of a center contact 51 connected to the center conductor 61 of the coaxial cable 60, a substantially columnar shaped insulator 52 through which the center contact 11 is inserted and held, and a substantially tubular shaped shell 53 housing and holding the insulator 52. The center contact 51 and shell 53 are for example comprised of copper or another conductive material. The insulator 52 is for example comprised of polytetrafluoroethylene (PTFE) or another low dielectric material. The insulator 52 is provided between the center contact 51 and the shell 53 so that the impedance of the center contact 51 becomes substantially 50Ω or 75Ω or another value suitable for the transmission line used.

The center connector 51 of the coaxial connector 50 passing through the through hole 31c is exposed at its front at the front surface 31a of the base board 31. Below, the part of the center connector 50 exposed at its front will be simply called the "front exposed part 51a". This front exposed part 51a is bent about 90 degrees and is joined by soldering 51b to the signal pattern 33 formed on the front surface 31a of the base board 31.

To prevent the coaxial connector 50 from passing right through the through hole 31c of the base board 31, the coaxial connector 50 is provided with a fixing member 70. This fixing member 70, as shown in FIG. 2B, is a flat plate shaped member formed with a notch 71 from its approximate center to one side face. This notch 71 guides the front exposed part 51a of the center contact 51 to the front surface 31a of the base board 31. Further, as shown in FIG. 2A, the part of the fixing member 70 other than the notch 71 holds the shell 53. By joining the fixing member 70 by soldering 72 to the base board 31 (more specifically, the GND pattern 35), the coaxial connector 50 is prevented from passing right through the through hole 31c.

Further, in the present embodiment, the fixing member 70 is provided on top with a cover member 80A. This cover member 80A, as shown in FIG. 3A and FIG. 3B, is a flat plate shaped member comprised of a first board 81 and first GND layer 82. The first board 81 is arranged so as to contact the front exposed part 51a of the center contact 51 of the coaxial connector 50 (shown by the broken line in FIG. 3B) through the signal pattern 87. The first board 81 is formed with the first GND layer 82 at the side opposite to the side contacting the front exposed part 51a. Note that the signal pattern 87 formed on the first board 81 is a pattern designed to contact the front exposed part 51a of the center contact 51 and easily realize impedance matching with the first GND layer 82 with a good precision. In the present invention, the signal pattern 87 is not an essential requirement. It is also possible not to provide the signal pattern 87 and to make the front exposed part 51a of the center contact 51 directly contact the first board 81.

The first board 81 is for example comprised of a polyimide resin or polytetrafluoroethylene (PTFE) or another low dielectric material and is preferably comprised of the same material as the material forming the base board 31. The first board 81 has a thickness T such that the impedance of the front exposed part 51a of the center contact 51 of the coaxial connector 50 becomes substantially 50Ω or 75Ω or another value suitable for the transmission line used. For this reason, in the present embodiment, the impedance of the front exposed part 51a of the center contact 51 is matched with the impedance of the center conductor 51 of the coaxial connector 50 or the signal pattern 33 on the base board 31.

Further, in the present embodiment, the front exposed part 51a of the center contact 51 is covered by the cover member 80A, so it is possible to suppress leakage of the signal from the front exposed part 51a to the outside and the entry of noise from the front exposed part 51a to the transmission line.

As shown in FIG. 3A and FIG. 3B, at the cover member 80A, the three surfaces soldered to GND patterns 35 formed on the front surface 31a of the base board 31 (the three side faces of the cover member 80B except the direction in which the center contact 51 of the coaxial connector 50 extends) are formed with metal plating layers 86 by metal etching. Due to this, the thin part constituted by the cover member 80A can be easily soldered to the base board 31.

Second Embodiment

Figure 4A:
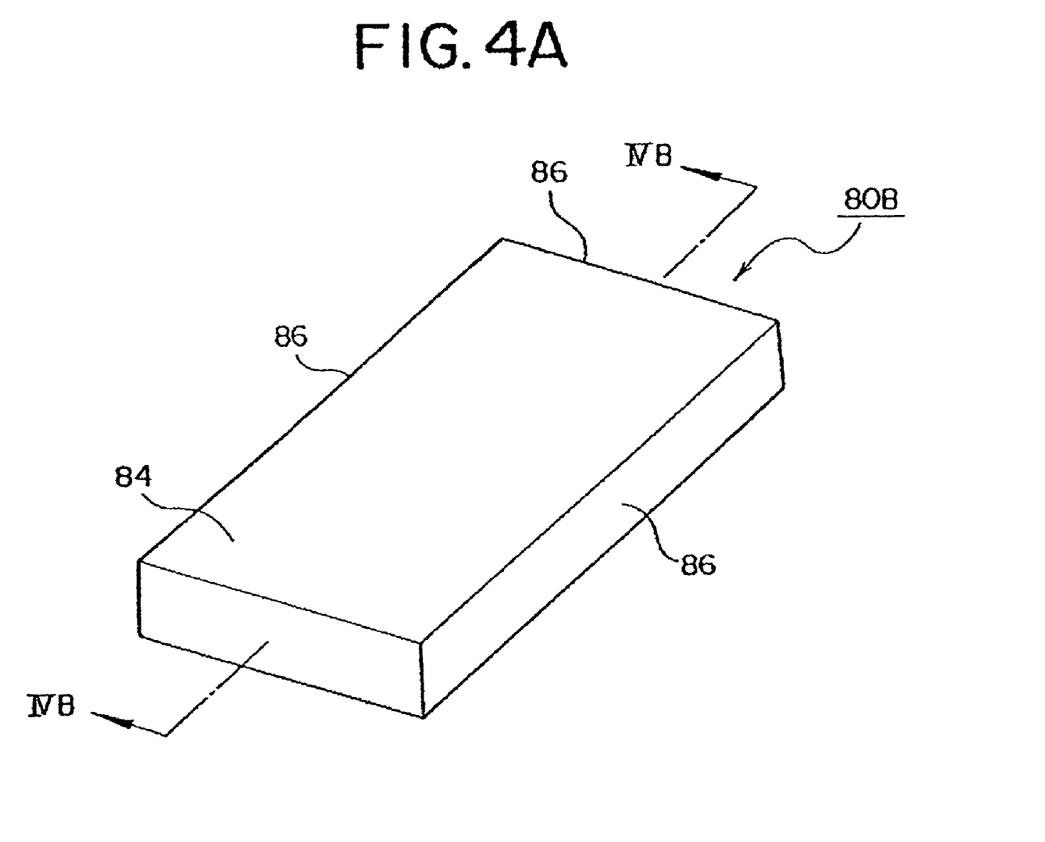
FIG. 4A is a perspective view of a cover member according to a second embodiment of the present invention.
Figure 4B:
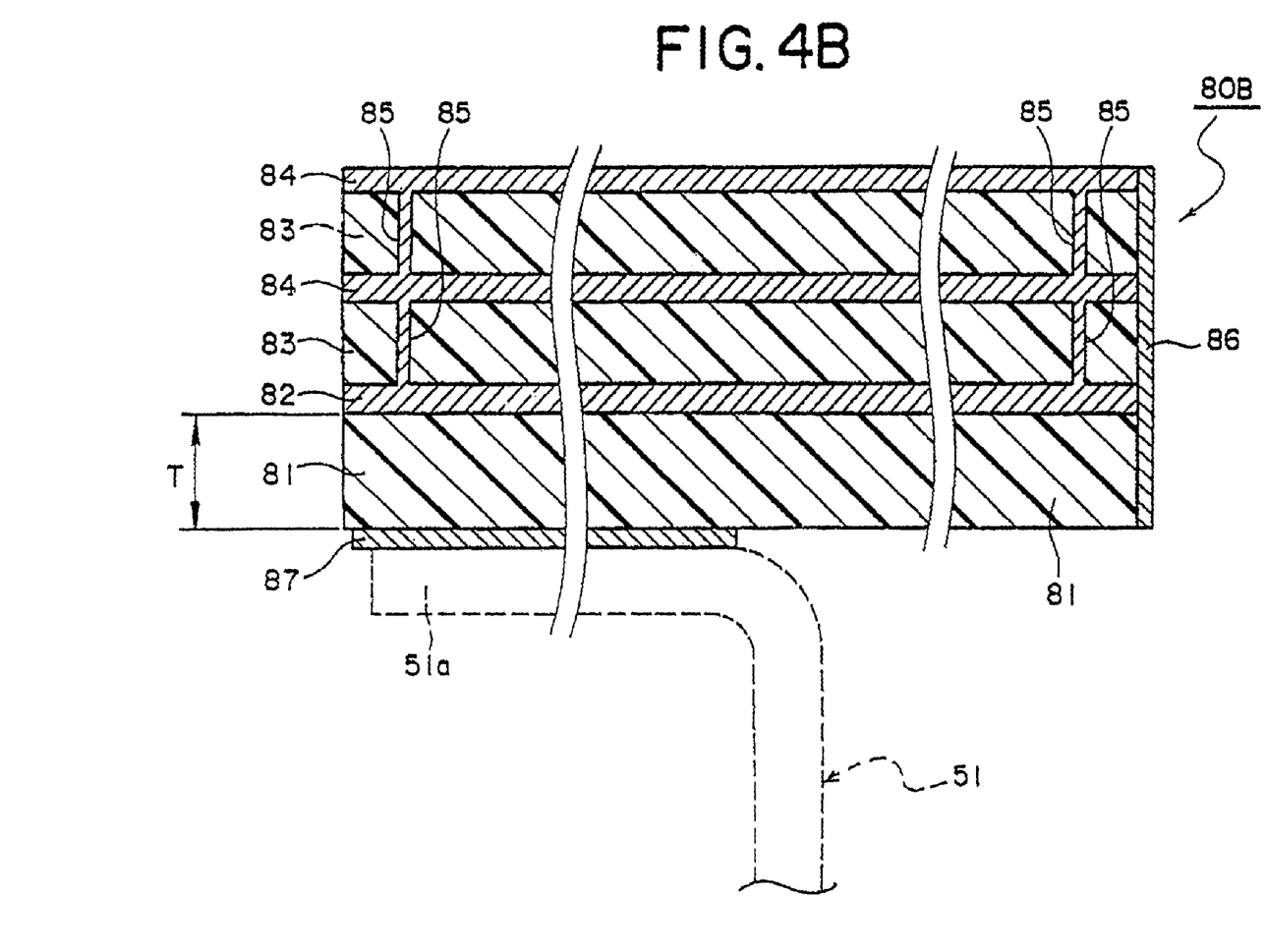
FIG. 4B is a cross-sectional view along the line IVB-IVB of FIG. 4A.

FIG. 4A is a perspective view of a cover member according to a second embodiment of the present invention, while FIG. 4B is a cross-sectional view along the line IVB-IVB of FIG. 4A.

The performance board according to the present embodiment differs from the first embodiment in the point of differing in thickness of the cover member 80A, but the rest of the configuration is the same. Below, only the point of difference of the performance board in the present embodiment from the first embodiment will be explained.

The cover member 80B in the present embodiment, as shown in FIG. 4A and FIG. 4B, is provided with, in addition to the first board 81 and first GND layer 82, two second boards 83 and two second GND layers 84.

The first board 81, in the same way as the first cover member 80A, is arranged so as to contact the front exposed part 51a of the center contact 51 of the coaxial connector 50 (shown by the broken line in FIG. 4B) through the signal pattern 87. Further, this first board 81 is formed with the first GND layer 82 at the side opposite to the side contacting the front exposed part 51a. Note that the signal pattern 87 formed on the first board 81 is a pattern designed to contact the front exposed part 51a of the center contact 51 and easily and precisely realize impedance matching with the first GND layer 82. Note that in the present invention, the signal pattern 87 is not an essential requirement. It is also possible not to provide the signal pattern 87 and to make the front exposed part 51a of the center contact 51 directly contact the first board 81.

In the present embodiment two second boards 83 are stacked on the first GND layer 82. Further, second GND layers 84 are formed between these second boards 83 and at the front surface of the topmost second board 83.

The first and second boards 81 and 83 are both for example comprised of a polyimide resin or polytetrafluoroethylene (PTFE) or another low dielectric material and preferably are comprised of the same material as the material forming the base board 31.

The first board 81, like the cover member 80A in the first embodiment, has a thickness T so that the impedance of the front exposed part 51a of the center contact 51 of the coaxial connector 50 becomes substantially 50Ω or 75Ω or another value suitable for the transmission line used. As opposed to this, the second board 83 is a dummy for increasing the total thickness for the purpose of improving the structural strength of the cover member 80B, so is not particularly limited in thickness for impedance matching.

In the present embodiment, in addition to the impedance matching of the front exposed part 51*a* by the first board 81, the thin part constituted by the cover member 80B can be made thicker by the second boards 83 and second GND layers 84, so the cover member 80B becomes easier to handle.

Further, in the present embodiment, the first GND layer 82 and the two second GND layers 84 are electrically connected through via holes 85. When the end faces of the first GND layer 82 are not exposed at the side faces of the cover member 80B, it is possible to electrically connect the first GND layer 82 to the shell 53 of the coaxial connector 50 or the GND layer 34 of the base board 31 through the topmost second GND layer 84 and possible to further stabilize the transmission stability at the performance board.

As shown in FIG. 4A and FIG. 4B, in the cover member 80B, the three surfaces soldered to GND patterns 35 formed on the front surface 31*a* of the base board 31 (the three side faces of the cover member 80B except the direction in which the center contact 51 of the coaxial connector 50 extends) are formed with metal plating layers 86 by metal etching. Due to this, in addition to improving the efficiency of the work for attachment of the cover member 80A, the first GND layer 82 and second GND layers 84 can be electrically connected at their end faces, so the transmission stability in the performance board can be further stabilized.

Third Embodiment

Figure 5:
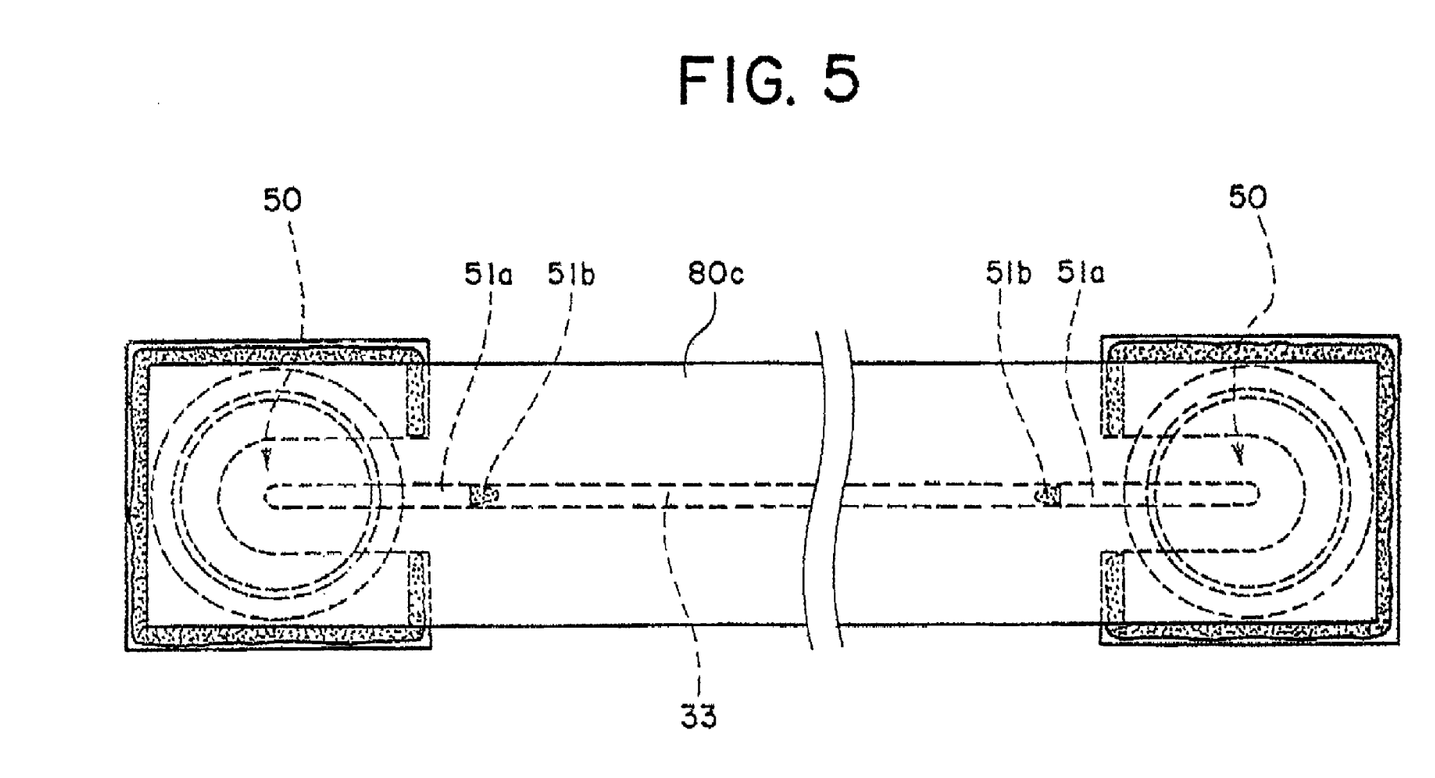
FIG. 5 is an enlarged sectional view of a connection part of a coaxial connector at a performance board according to a third embodiment of the present invention.

FIG. 5 is an enlarged sectional view showing the connection part of the coaxial connector in the performance board according to a third embodiment of the present invention.

In the first and second embodiments, the explanation was given of covering only a single coaxial connector 50 passing through the through hole 31*a* (specifically the front exposed part 51*a* of the center contact 51) by the cover members 80A and 80B, but as shown in FIG. 5, it is also possible to cover a plurality of coaxial connectors 50 connected by the same signal pattern 33 on the base board 31 by a single cover member 80C.

In the first to third embodiments, the explanation was given of an example of application of the present invention to a performance board used for the test of a packaged IC device. While the present invention is not particularly limited to this, as explained in the following fourth embodiment, it is also possible to apply the invention to a probe card used for the test of an IC device formed on a semiconductor wafer.

Fourth Embodiment

Figure 6:
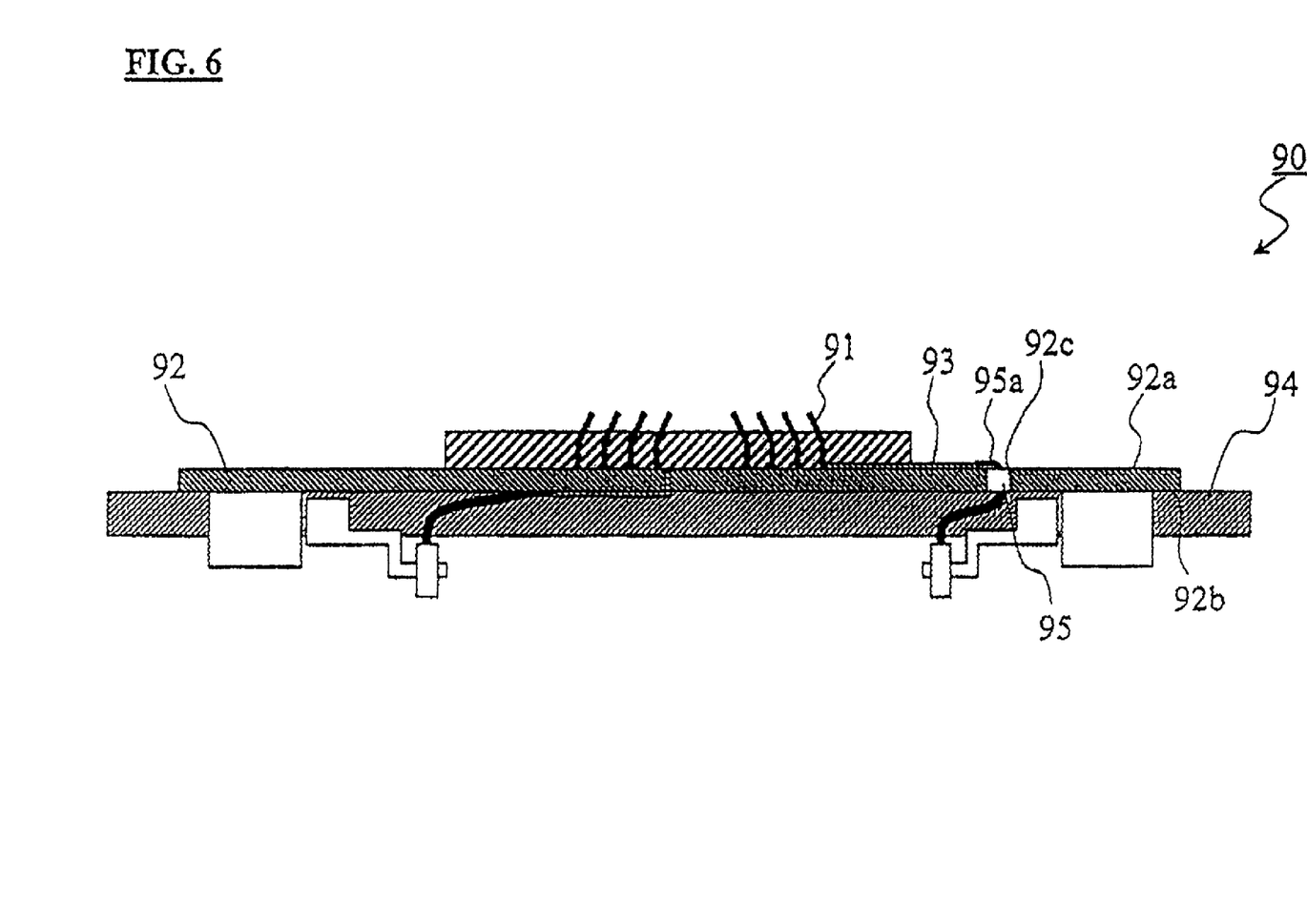
FIG. 6 is a cross-sectional view of a probe card according to a fourth embodiment of the present invention.

FIG. 6 is a cross-sectional view showing a probe card according to a fourth embodiment of the present invention.

The probe card 90 according to the present embodiment, as shown in FIG. 6, is provided with a plurality of probe needles 91 for electrical connection to an IC device, a base board 92 to which the probe needles 91 are mounted on the front surface 92*a*, a coaxial connector 95 inserted in a through hole 92*c* from the back surface 92*b* toward the front surface 92*a* of the base board 92, and a stiffener 94 attached to the back surface 92*b* of the base board 92 for improving the structural strength of the probe card 90. The front exposed part 95*a* of the center contact of the coaxial connector 95 is electrically connected to a signal pattern 93 formed on the front surface 92*a* of the base board 92.

While the illustration is omitted in FIG. 6, in the present embodiment, the front exposed part 95*a* of the coaxial connector 95 is covered by a cover member 80A in the same way as the first embodiment. For this reason, the impedance of the front exposed part 95*a* of the coaxial connector 95 is matched with the impedance around it. Further, it is possible to suppress the leakage of the signal from the front exposed part 95*a* to the outside or entry of noise from the front exposed part 95*a* to the transmission line. Note that in the present embodiment, as the cover member covering the front exposed part 95*a*, instead of the cover member 80A explained in the first embodiment, it is also possible to use the cover member 80B having the second boards 83 and second GND layers 84 explained in the second embodiment.

Note that the embodiments explained above were described for the purpose of facilitating understanding of the present invention and were not described for limiting the present invention. Therefore, the elements disclosed in the above embodiments include all design changes and equivalents falling under the technical scope of the present invention.

For example, a performance board or probe card to which a through-the-board type coaxial connector is already attached may be provided with a cover member by later attachment. This enables the transmission characteristics of an existing performance board or probe card provided with a through-the-board type coaxial connector to be easily and inexpensively stabilized.

The invention claimed is:

1. A measurement board for electrically connecting an electronic device under test and a test apparatus, comprising:
    a base board having a contactor to which the electronic device under test is to be electrically connected mounted on its front surface, and having a signal conductor interconnect electrically connected to the contactor and formed on its front surface;
    a coaxial connector to which a coaxial cable electrically connecting the measurement board and the test apparatus is connected, passing through the base board from its back surface toward its front surface, and having a front exposed part of a center contact bent and electrically connected to the signal conductor interconnect; and
    a cover member covering and contacting at least part of the front exposed part of the center contact, wherein
    the cover member has
        a first conductor interconnect arranged in parallel with a contact portion of the front exposed part which contacts the cover member and
        a first dielectric arranged between the contact portion of the front exposed part and the first conductor interconnect, and
    a main surface of the first conductor interconnect faces the contact portion of the front exposed part.

2. The measurement board as set forth in claim 1, wherein the contact portion of the front exposed part, the first conductor interconnect and the first dielectric are arranged in parallel with the front surface of the base board.

3. The measurement board as set forth in claim 2, wherein the first conductor interconnect is a GND pattern formed on a front surface of the first dielectric and not electrically connected with the center contact, and
    the first dielectric has a thickness making an impedance of the front exposed part match impedances around the front exposed part in the center contact.

4. The measurement board as set forth in claim 2, wherein the first dielectric is made of a material the same as the material forming the base board.

5. The measurement board as set forth in claim 1, wherein a surface of the cover member to be soldered to the base board comprises a metal plating layer.

6. The measurement board as set forth in claim 1, wherein
the electronic device under test is a packaged semiconductor device, and
the contactor is a socket mounted on the front surface of the base board that electrically connects to the semiconductor device.

7. The measurement board as set forth in claim 1, wherein
the electronic device under test is a semiconductor device formed on a wafer, and
the contactor is a probe needle mounted on the front surface of the base board that electrically connects to the semiconductor device.

8. The measurement board as set forth in claim 1, wherein
the cover member covers a bent portion of the exposed part of the center contact.

\* \* \* \* \*